United States Patent
Song et al.

(10) Patent No.: US 11,031,453 B2
(45) Date of Patent: Jun. 8, 2021

(54) FLEXIBLE DISPLAY APPARATUS AND METHOD OF MANUFACTURING THE SAME

(71) Applicant: SAMSUNG DISPLAY CO., LTD., Yongin-si (KR)

(72) Inventors: Heerim Song, Yongin-si (KR); Gyungsoon Park, Yongin-si (KR); Mukyung Jeon, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 54 days.

(21) Appl. No.: 16/376,364

(22) Filed: Apr. 5, 2019

(65) Prior Publication Data
US 2020/0066819 A1    Feb. 27, 2020

(30) Foreign Application Priority Data
Aug. 23, 2018  (KR) .......................... 10-2018-0098758

(51) Int. Cl.
*H01L 27/32* (2006.01)
*H01L 51/00* (2006.01)
*H05K 1/18* (2006.01)

(52) U.S. Cl.
CPC ...... *H01L 27/3276* (2013.01); *H01L 27/3248* (2013.01); *H01L 51/0097* (2013.01); *H05K 1/189* (2013.01); *H01L 2227/323* (2013.01); *H01L 2251/5338* (2013.01); *H05K 2201/10128* (2013.01)

(58) Field of Classification Search
CPC ... H01L 51/00; H01L 51/009; H01L 51/0097; H01L 27/32; H01L 27/324; H01L 27/3248; H01L 27/327; H01L 27/3276; H05K 1/189
USPC .......................................................... 257/40
See application file for complete search history.

(56) References Cited

U.S. PATENT DOCUMENTS

| | | | |
|---|---|---|---|
| 9,786,229 B2 | 10/2017 | Lee et al. | |
| 9,893,139 B2 | 2/2018 | Kim et al. | |
| 10,658,628 B2 * | 5/2020 | Lee | .......... H01L 51/56 |
| 2017/0288002 A1 | 10/2017 | Kim et al. | |
| 2018/0006004 A1 | 1/2018 | Namkung et al. | |

FOREIGN PATENT DOCUMENTS

| | | |
|---|---|---|
| KR | 10-2016-0141307 A | 12/2016 |
| KR | 10-2017-0051667 A | 5/2017 |
| KR | 10-2017-0114027 A | 10/2017 |
| KR | 10-2017-0136484 A | 12/2017 |
| KR | 10-2018-0003716 A | 1/2018 |

* cited by examiner

*Primary Examiner* — Monica D Harrison
(74) *Attorney, Agent, or Firm* — Kile Park Reed & Houtteman PLLC

(57) ABSTRACT

A flexible display apparatus includes a panel that includes a display area that displays images and a fan-out portion in which a plurality of wirings connected to the display area are located, and a driving chip connected to the fan-out portion and connected to the display area via the plurality of wirings. The plurality of wirings arranged in the fan-out portion may include first wirings at a first layer on the panel and second wirings at a second layer that is different from the first layer. The first wirings and the second wirings may be in an overlapping relationship above and below each other.

22 Claims, 6 Drawing Sheets

FLEXIBLE DISPLAY APPARATUS AND METHOD OF MANUFACTURING THE SAME

CROSS-REFERENCE TO RELATED APPLICATION

Korean Patent Application No. 10-2018-0098758, filed on Aug. 23, 2018, in the Korean Intellectual Property Office, and entitled: "Flexible Display Apparatus and Method of Manufacturing the Same," is incorporated by reference herein in its entirety.

BACKGROUND

1. Field

One or more embodiments relate to a flexible display apparatus and a method of manufacturing the flexible display apparatus, and more particularly, to a flexible display apparatus including a fan-out portion which connects a display area to a driving chip, and a method of manufacturing the flexible display apparatus.

2. Description of the Related Art

Flexible display apparatuses include a panel having flexibility by arranging a device layer for realizing images on a flexible substrate, and have an advantage in that the panel may be used after being bent with appropriate curvature.

SUMMARY

Embodiments are directed to a flexible display apparatus, including a panel that includes a display area that displays images and a fan-out portion in which a plurality of wirings connected to the display area are located, and a driving chip connected to the fan-out portion and connected to the display area via the plurality of wirings. The plurality of wirings arranged in the fan-out portion may include first wirings at a first layer on the panel and second wirings at a second layer that is different from the first layer. The first wirings and the second wirings may be in an overlapping relationship above and below each other.

A single insulating layer may be provided between the first layer and the second layer.

A plurality of insulating layers may be provided between the first layer and the second layer.

The fan-out portion may be foldable.

A folding axis of the fan-out portion may be in a direction intersecting a direction in which the display area is linearly connected to the driving chip.

The fan-out portion may include a diagonal connector in which the first wirings and the second wirings diagonally connect the display area to the driving chip.

The fan-out portion may include a straight connector in which the first wirings and the second wirings linearly connect the display area to the driving chip.

The flexible display apparatus may further include a flexible circuit board connected to the fan-out portion. The driving chip may be loaded on the flexible circuit board.

The display area may include a thin-film transistor and an organic light-emitting device. The thin-film transistor may include a gate electrode, an active layer, and source/drain electrodes. The organic light-emitting device may be connected to the thin-film transistor and may emit light.

The gate electrode may include a gate lower layer and a gate upper layer. The first wirings and the second wirings may be at same layers, respectively, as the gate lower layer and the gate upper layer.

Embodiments are also directed to a method of manufacturing a flexible display apparatus, the method including forming, on a panel, a display area that displays images, forming a fan-out portion by arranging first wirings at a first layer of the panel and second wirings at a second layer that is different from the first layer, wherein the first wirings are connected to the display area, and the second wirings are connected to the display area and overlap the first wirings, and connecting the first and second wirings of the fan-out portion to a driving chip.

A single insulating layer may be provided between the first layer and the second layer.

A plurality of insulating layers may be provided between the first layer and the second layer.

The fan-out portion of the panel may be foldable.

A folding axis of the fan-out portion may be in a direction intersecting with a direction in which the display area is linearly connected to the driving chip.

The fan-out portion may include a diagonal connector in which the first wirings and the second wirings diagonally connect the display area to the driving chip.

The fan-out portion may include a straight connector in which the first wirings and the second wirings linearly connect the display area to the driving chip.

The method may further include connecting the fan-out portion to the flexible circuit board. The driving chip may be loaded on the flexible circuit board.

Forming the display area may include forming a thin-film transistor including a gate electrode, an active layer, and source/drain electrodes and forming an organic light-emitting device that is connected to the thin-film transistor and which emits light.

The gate electrode may include a gate lower layer and a gate upper layer. The first wirings and the second wirings may be provided respectively at the same layers as the gate lower layer and the gate upper layer.

BRIEF DESCRIPTION OF THE DRAWINGS

Features will become apparent to those of skill in the art by describing in detail exemplary embodiments with reference to the attached drawings in which.

DETAILED DESCRIPTION

Figure 1:
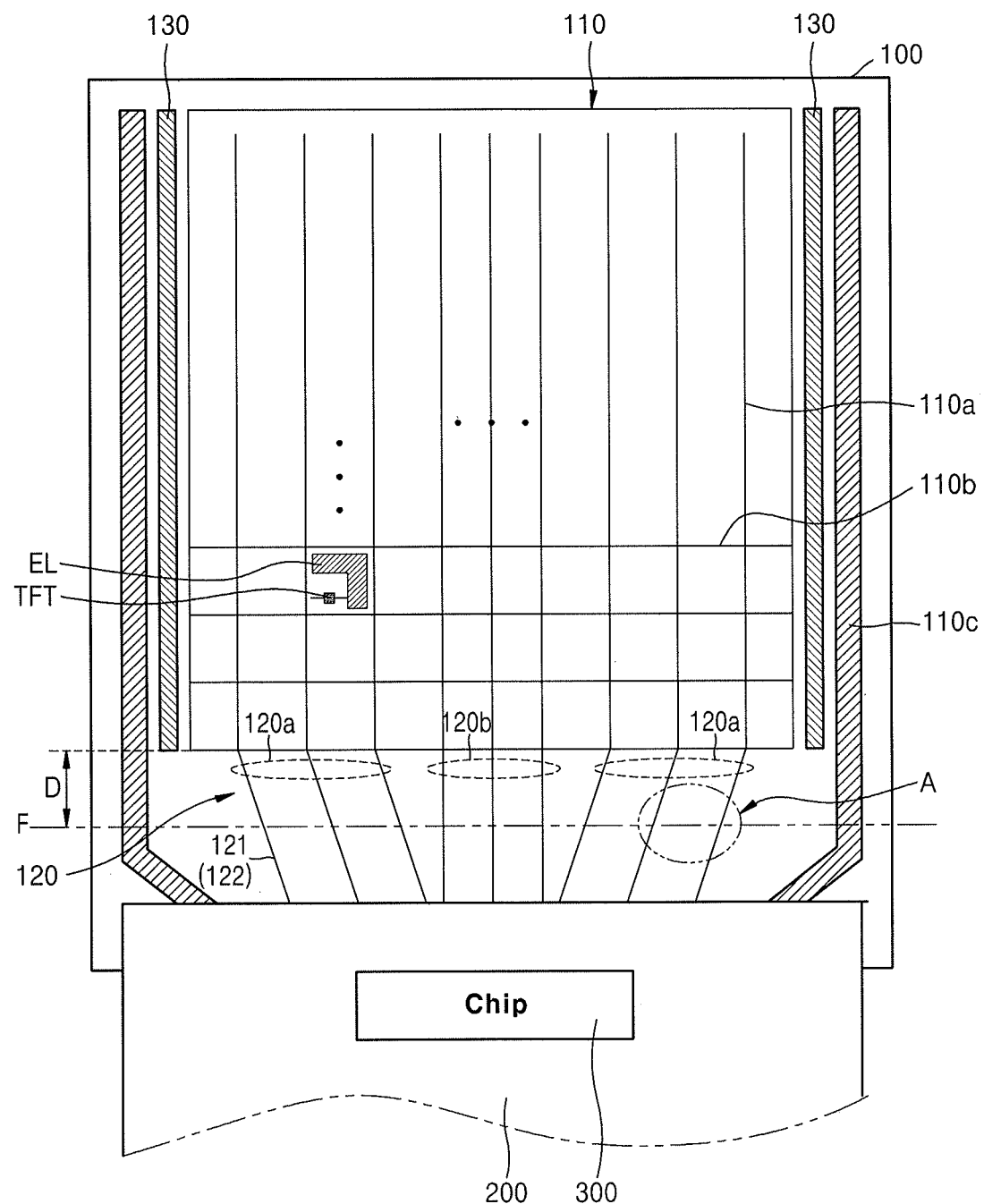
FIG. 1 illustrates a plan view of a flexible display apparatus according to an embodiment.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

While such terms as "first," "second," etc., may be used to describe various components, such components must not be limited to the above terms. The above terms are used only to distinguish one component from another.

An expression used in the singular encompasses the expression of the plural, unless it has a clearly different meaning in the context.

When a certain embodiment may be implemented differently, a specific process order may be performed differently from the described order. For example, two consecutively described processes may be performed substantially at the same time or performed in an order opposite to the described order.

Figure 2:
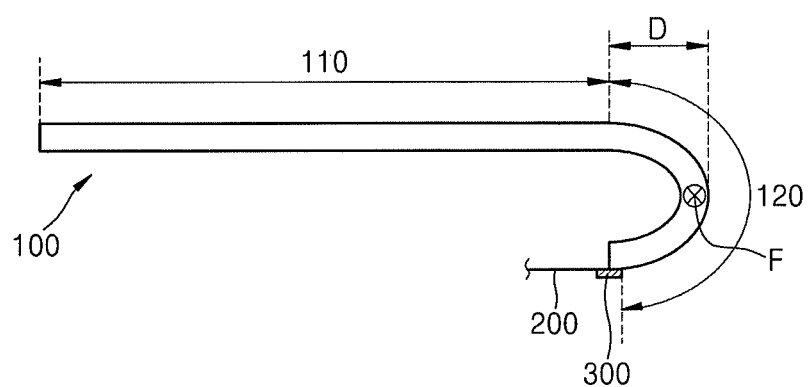
FIG. 2 illustrates a side view showing a folded state of a fan-out portion in the flexible display apparatus of FIG. 1.

FIG. 1 illustrates a plan view of a panel 100 in a flexible display apparatus according to an embodiment, and FIG. 2 illustrates a side view of the panel 100, in which a fan-out portion 120 is folded along a folding axis F of FIG. 1. The panel 100 may be accommodated in a case to be protected.

Referring to FIG. 1, the panel 100 includes a display area 110 for displaying image, a driving chip 300 serving as a controller, and the fan-out portion 120 in which wirings 121 and 122 for connecting the display area 110 to the driving chip 300 are arranged. A flexible circuit board 200 is connected to the fan-out portion 120, and the driving chip 300 is loaded on the flexible circuit board 200 to be connected to the fan-out portion 120.

The display area 110 includes a plurality of data lines 110a receiving data signals and a plurality of gate lines 110b receiving scan signals, wherein the data lines 110a and the gate lines 110b perpendicularly intersect with each other, and a thin film transistor TFT and an organic light-emitting device EL connected to the thin film transistor TFT are arranged in each of intersections to configure one pixel. Here, only one thin film transistor TFT and one organic light-emitting device EL are shown for convenience of description, but it may be appreciated that the thin film transistor TFT and the organic light-emitting device EL are arranged in every intersection.

Therefore, when a scan signal and a data signal are respectively applied to the gate line 110b and the data line 110a via the driving chip 300, the thin film transistor TFT arranged in an intersection of the gate line 110b and the data line 110a applies a voltage signal to the organic light-emitting device EL according to the scan signal and the data signal. Accordingly, the organic light-emitting device EL emits light to display image. A common voltage line 110c applies a voltage to an opposite electrode 113 (see FIG. 5) of the organic light-emitting device EL. The opposite electrode 113 is described below.

The fan-out portion 120 may include a plurality of wirings 121 and 122 for connecting the data lines 110a to the driving chip 300. The wirings 121 and 122 may form a straight connector 120b that linearly connects the display area 110 to the driving chip 300 or a diagonal connector 120a that diagonally connects the display area 110 to the driving chip 300. For convenience of illustration, the data lines 110a and the wirings in the fan-out portion 120 are shown to be spaced with large intervals therebetween, but actually the data lines 110a and the wirings in the fan-out portion 120 may be densely arranged. The gate lines 110b may be connected to internal circuits 130 arranged at opposite sides of the display area 110.

In addition, when the panel 100 is folded as shown in FIG. 2 about an intermediate portion of the fan-out portion 120 as a folding axis F, the flexible circuit board 200 on which the driving chip 300 is mounted may be located under the panel 100. Therefore, in a state where the panel 100 is assembled with a case, when the panel 100 is seen in a plan view, the flexible circuit board 200 and the driving chip 300 are not visible and only the display area 110 and a dead space around the display area 110 are visible.

In the fan-out portion 120, a region between the display area 110 and the folding axis F, wherein the region is not folded under the panel 100, remains as a dead space D, and an area of the dead space D is largely related to an area occupied by the wirings 121 and 122. For example, as described above with reference to FIG. 1, the wirings 121 and 122 do not only form the straight connector 120b. Some of the wirings 121 and 122 form the diagonal connector 120a in the fan-out portion 120. Thus, when an occupied area of the wirings 121 and 122 on a plane increases, a length of the region between the display area 110 and the driving chip 300 occupied by the diagonal connector 120a increases. Accordingly, the dead space D after folding the panel 100 is also increased. Therefore, in order to reduce the area of the dead space D in the fan-out portion 120, it is desirable to reduce a planar occupation area of the wirings 121 and 122.

Figure 3:
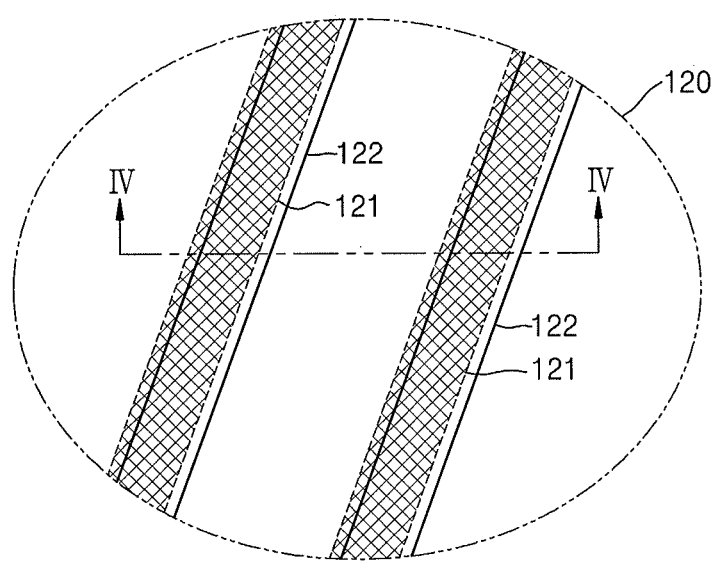
FIG. 3 illustrates a plan view showing an enlarged view of portion A in FIG. 1.
Figure 4:
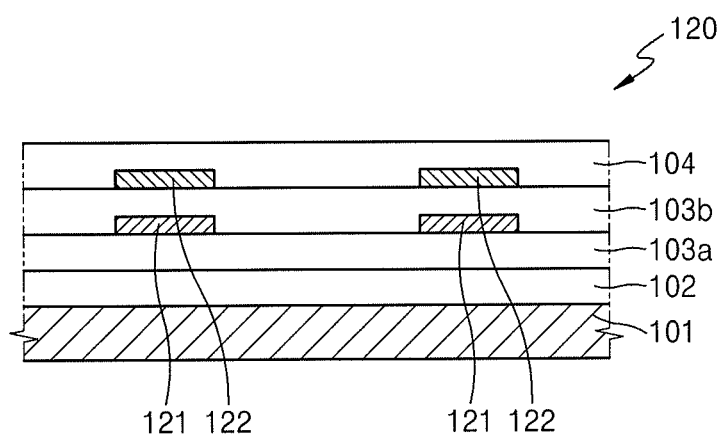
FIG. 4 illustrates a cross-sectional view taken along line IV-IV of FIG. 3.

To reduce a planar occupation area of the wirings 121 and 122, an embodiment provides an arrangement structure of the wirings 121 and 122 as shown in FIGS. 3 and 4. FIG. 3 illustrates a plan view showing an enlarged view of portion A of FIG. 1, and FIG. 4 illustrates a cross-sectional view taken along line IV-IV of FIG. 3. As shown in the drawings, the wirings 121 and 122 in the fan-out portion 120 may be arranged at different layers from each other with an insulating layer 103b provided therebetween. The wirings 121 and 122 may be arranged to overlap each other in the plan view. In FIG. 3, for convenience of comprehension, dashed lines are slightly shifted next to solid lines, but as shown in FIG. 4, the wiring 121 at a lower layer and the wiring 122 at an upper layer may be arranged at the same locations on a plane to overlap each other in a direction perpendicular to the substrate. Hereinafter, the lower layer will be referred to as a first layer and the upper layer will be referred to as a second layer. Wirings at the first layer will be referred to as first wirings 121 and wirings at the second layer will be referred to as second wirings 122.

The first wirings 121 and the second wirings 122 for connecting the data lines 110a to the driving chip 300 on the flexible circuit board 200 are arranged in the fan-out portion 120. The first and second wirings 121 and 122 may be arranged in different layers with the insulating layer 103b provided therebetween and may be arranged to overlap each other on a plan view. As such, more margin in intervals between the wirings may be obtained as compared with a case in which the first and second wirings 121 and 122 are all arranged at the same layer. An occupation area of the first and second wirings 121 and 122 on a plane may be reduced. Assuming that wirings of the same number and the same widths are arranged in the fan-out portion 120, a case in which the first and second wirings 121 and 122 are arranged in multiple layers may reduce the dead space D to about 70% or less as compared with a case in which the first and second wirings 121 and 122 are arranged at one layer.

The above structure of the fan-out portion 120 may be formed together with the forming of the thin film transistors TFT in pixels of the display area 110.

Cross-sectional structures of the thin film transistor TFT and the organic light-emitting device EL in each pixel will be described below with reference to FIG. 5.

Figure 5:
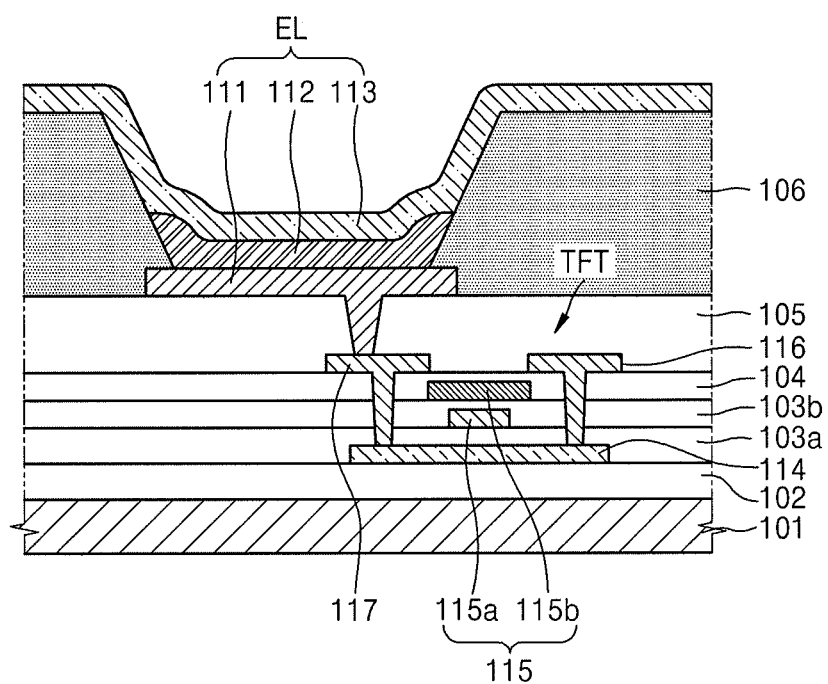
FIG. 5 illustrates a cross-sectional view of an internal structure of a display area shown in FIG. 1.

As shown in FIG. 5, each pixel includes the thin film transistor TFT and the organic light-emitting device EL.

In the thin film transistor TFT, an active layer 114 may be on a buffer layer 102 on a substrate 101. The active layer 114 may include a source region and a drain region doped with N-type or P-type impurities with high concentration. The active layer 114 may include an oxide semiconductor. For example, the oxide semiconductor may include an oxide of a material selected from Group 12, 13, and 14 metal elements such as zinc (Zn), indium (In), gallium (Ga), tin (Sn), cadmium (Cd), and germanium (Ge), and a combination thereof. For example, the active layer 114 may include G-I—Z—O [$(In_2O_3)a(Ga_2O_3)b(ZnO)c$] (wherein a, b, and c are real numbers respectively satisfying conditions a≥0, b≥0, and c>0). A gate electrode 115 may be arranged on the active layer 114 with gate insulating layers 103a and 103b provided therebetween. The gate electrode 115 may include a gate lower layer 115a and a gate upper layer 115b.

A source electrode 116 and a drain electrode 117 (hereinafter, referred to as source/drain electrodes) may be located above the gate electrode 115. An interlayer insulating layer 104 may be located between the gate electrode 115 and the source/drain electrodes 116 and 117. A passivation layer 105 may be located between the source/drain electrodes 116 and 117 and a pixel electrode 111 of the organic light-emitting device EL.

A pixel defining layer 106 may be on the pixel electrode 111. An opening may be provided in the pixel defining layer 106 to expose the pixel electrode 111. An emission layer 112 may be arranged on the exposed pixel electrode 111 through deposition.

The organic light-emitting device EL may emit red light, green light, or blue light according to a flow of an electric current to display predetermined image information. The organic light-emitting device EL may include the pixel electrode 111 connected to the drain electrode 117 of the thin film transistor TFT, the opposite electrode 113 facing the pixel electrode 111, and the emission layer 112 provided between the pixel electrode 111 and the opposite electrode 113 to emit light.

A hole injection layer (HIL), a hole transport layer (HTL), an electron transport layer (ETL), an electron injection layer (EIL), etc. may be stacked adjacent to the emission layer 112.

The opposite electrode 113 may be connected to the common voltage line 110c.

Referring back to FIG. 4, the first wirings 121 and the second wirings 122 may be provided on, for example, the same layers as the gate lower layer 115a and the gate upper layer 115b in the gate electrode 115.

Like the display area 110, the fan-out portion 120 may have a base structure in which the buffer layer 102 is on the substrate 101, and an insulating layer 103a, such as the gate insulating layer 103a of the display area 110, is located thereon.

When the gate lower layer 115a of the gate electrode 115 in the display area 110 is formed, the first wirings 121 may be formed in the fan-out portion 120 by using the same material at the same layer as the gate lower layer 115a.

The gate insulating layer 103b may be located on the first wirings 121. When the gate upper layer 115b of the gate electrode 115 in the display area 110 is formed, the second wirings 122 may be formed in the fan-out portion 120 by using the same material at the same layer as that the gate upper layer 115b.

The gate lower layer 115a and the gate upper layer 115b may include different materials from each other. The first wirings 121 and the second wirings 122 may have different materials from each other. For example, the gate electrode 115 and the first and second wirings 121 and 122 may include Mo.

When the interlayer insulating layer 104 of the display area 110 is formed, the interlayer insulating layer 104 may also be formed on the second wirings 122.

As such, the wiring structure in the multiple layers as shown in FIGS. 3 and 4 may be provided while forming the thin film transistor TFT of the display area 110. In some implementations, the fan-out portion 120 may be provided through separate processes, instead of simultaneously with the arrangement of the thin film transistor TFT in the display area 110.

According to the above structure, an area occupied by the entire wirings, in particular, an entire occupation area in a line width direction in a plan view, may be reduced as compared with a case in which the first and second wirings 121 and 122 are all arranged in the same layer. As described above with reference to FIG. 1, the number of wirings arranged in a width direction of the diagonal connector 120a on the plan view may be reduced to half A length of the fan-out portion 120 between the display area 110 and the driving chip 300 may be also reduced. The size of the dead space D remaining at one end of the display area 110 when the fan-out portion 120 is folded about the folding axis F may also be reduced, and a panel 100 having a high screen utilization rate may be implemented.

When there is a margin for an interval between lines when the first and second wirings 121 and 122 are arranged in multiple layers, there may be little risk of causing a short circuit between wirings that could occur if a remaining film of the second wirings 122, which is not completely removed, were to be sandwiched between the first wirings 121 under the second wirings 122 during the arranging of the second wirings 122.

Therefore, when adopting the structure of the above fan-out portion 120, the dead space D may be narrow and the screen utilization rate may be increased. Moreover, there may be a margin in the interval between wirings, and the panel 100 may be stabilized.

Figure 6:
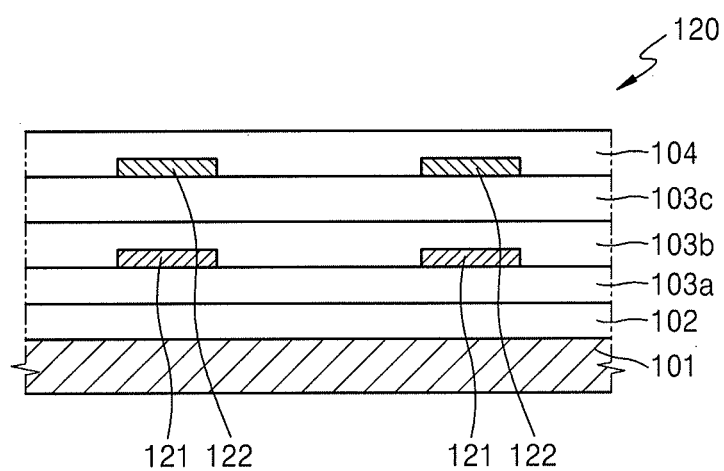
FIG. 6 illustrates a cross-sectional view showing a modified example of a line stack structure shown in FIG. 4.

In the above embodiment, the single insulating layer 103b may be provided between the first wirings 121 in the first layer and the second wirings 122 in the second layer. In some implementations, as shown in FIG. 6, a plurality of insulating layers 103b and 103c may be provided between the first wirings 121 and the second wirings 122. For example after forming the first wirings 121, the two insulating layers 130b and 103c may be on the first wirings 121, and then, the second wirings 122 may be formed on the insulating layers 103a and 103b. The interlayer insulating layer 104 may cover the second wirings 122. As such, the first wirings 121 and the second wirings 122 may be insulated from each other, and a generation of a parasitic capacitor may be prevented for example, the first and second wirings 121 and 122 may be arranged in multiple layers to overlap each other. The insulating layer between the first and second wirings 121 and 122 may be provided as a single layer or as two or more layers, and various modifications may be provided.

In the above embodiment, the first wirings 121 and the second wirings 122 have the same widths as each other. In some implementations, the first and second wirings 121 and 122 may have different widths from each other. For example, the first wirings 121 and the second wirings 122 having different widths from each other may at least partially overlap each other. For example, in some implementations, the first wirings 121 and the second wirings 122 may not have the same widths as each other.

By way of summation and review, a panel included in flexible display apparatuses may include a display area for displaying images, and a fan-out portion electrically connecting a driving chip provided at an end side of the panel to the display area.

Recently, it has become desirable to reduce a non-display area, that is, a dead space, on an outer portion of a panel outside the display area. In a flexible display apparatus, a middle portion of the fan-out portion may be curved such that the end side where the driving chip is located is bent beneath a main body of the panel. When a length of the fan-out portion increases, a portion of the fan-out portion at an upper surface of the main body of the panel, wherein the portion of the fan-out portion remains next to the display area after being bent and is seen by the eyes of a user as a dead space, also increases.

As described above, according to the flexible display apparatus and the method of manufacturing the flexible display apparatus of the embodiments, the panel 100 having a small dead space D and electrically stabilized may be implemented. Thus, the flexible display apparatus adopting the panel 100 may have improved performance and reliability. In addition, since additional electric devices such as a thin filth transistor are not added to reduce the fan-out portion, reduction in the dead space may be effectively achieved without complicating the structure.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope thereof as set forth in the following claims.

What is claimed is:

1. A display apparatus, comprising:
a panel including a display area that displays images and a fan-out portion in which a plurality of wirings connected to the display area are located; and
a driving chip connected to the fan-out portion and connected to the display area via the plurality of wirings, wherein:
the plurality of wirings arranged in the fan-out portion include first wirings at a first layer on the panel and second wirings at a second layer that is different from the first layer,
the first wirings and the second wirings are in an overlapping relationship above and below each other, and
the first wirings and the second wirings are electrically separate from each other.

2. The display apparatus as claimed in claim 1, wherein a single insulating layer is provided between the first layer and the second layer.

3. The display apparatus as claimed in claim 1, wherein a plurality of insulating layers are provided between the first layer and the second layer.

4. The display apparatus as claimed in claim 1, wherein the fan-out portion is foldable.

5. The display apparatus as claimed in claim 4, wherein a folding axis of the fan-out portion is in a direction intersecting a direction in which the display area is linearly connected to the driving chip.

6. The display apparatus as claimed in claim 5, wherein the fan-out portion includes a diagonal connector in which the first wirings and the second wirings diagonally connect the display area to the driving chip.

7. The display apparatus as claimed in claim 6, wherein the fan-out portion includes a straight connector in which the first wirings and the second wirings linearly connect the display area to the driving chip.

8. The display apparatus as claimed in claim 1, further comprising a flexible circuit board connected to the fan-out portion, wherein the driving chip is on the flexible circuit board.

9. The display apparatus as claimed in claim 1, wherein:
the display area includes a thin-film transistor and an organic light-emitting device,
the thin-film transistor includes a gate electrode, an active layer, and source/drain electrodes, and
the organic light-emitting device is connected to the thin-film transistor and emits light.

10. The display apparatus as claimed in claim 9, wherein:
the gate electrode includes a gate lower layer and a gate upper layer, and
the first wirings and the second wirings are at same layers, respectively, as the gate lower layer and the gate upper layer.

11. The display apparatus as claimed in claim 1, wherein a first wiring of the first wirings and a second wiring of the second wirings overlap one another in plan view and are electrically separate from each other.

12. A method of manufacturing a display apparatus, the method comprising:
forming, on a panel, a display area that displays images;
forming a fan-out portion by arranging first wirings at a first layer of the panel and second wirings at a second layer that is different from the first layer, wherein the first wirings are connected to the display area, the second wirings are connected to the display area and overlap the first wirings, and the first wirings and the second wirings are electrically separate from each other; and
connecting the first and second wirings of the fan-out portion to a driving chip.

13. The method as claimed in claim 12, wherein a single insulating layer is provided between the first layer and the second layer.

14. The method as claimed in claim 12, wherein a plurality of insulating layers are provided between the first layer and the second layer.

15. The method as claimed in claim 12, wherein the fan-out portion of the panel is foldable.

16. The method as claimed in claim 15, wherein a folding axis of the fan-out portion is in a direction intersecting with a direction in which the display area is linearly connected to the driving chip.

17. The method as claimed in claim 16, wherein the fan-out portion includes a diagonal connector in which the first wirings and the second wirings diagonally connect the display area to the driving chip.

18. The method as claimed in claim 17, wherein the fan-out portion includes a straight connector in which the first wirings and the second wirings linearly connect the display area to the driving chip.

19. The method as claimed in claim 12, further comprising connecting the fan-out portion to a flexible circuit board, wherein the driving chip is loaded on the flexible circuit board.

20. The method as claimed in claim 12, wherein forming the display area includes:

forming a thin-film transistor including a gate electrode, an active layer, and source/drain electrodes; and forming an organic light-emitting device that is connected to the thin-film transistor and which emits light.

21. The method as claimed in claim 20, wherein the gate electrode includes a gate lower layer and a gate upper layer, and the first wirings and the second wirings are provided respectively at same layers as the gate lower layer and the gate upper layer.

22. The method as claimed in claim 12, wherein a first wiring of the first wirings and a second wiring of the second wirings overlap one another in plan view and are electrically separate from each other.

* * * * *